United States Patent
Fan

(10) Patent No.: US 7,547,974 B2
(45) Date of Patent: Jun. 16, 2009

(54) WIRING SUBSTRATE WITH IMPROVEMENT IN TENSILE STRENGTH OF TRACES

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 355 days.

(21) Appl. No.: 11/640,262

(22) Filed: Dec. 18, 2006

(65) Prior Publication Data
US 2008/0142985 A1  Jun. 19, 2008

(51) Int. Cl.
*H01L 23/48* (2006.01)
*H05K 1/00* (2006.01)
*H05K 7/00* (2006.01)

(52) U.S. Cl. .................. 257/773; 257/775; 174/250; 361/777

(58) Field of Classification Search .................. None
See application file for complete search history.

(56) References Cited

U.S. PATENT DOCUMENTS

| | | | | |
|---|---|---|---|---|
| 5,706,174 A | * | 1/1998 | Distefano et al. | 361/749 |
| 6,365,439 B2 | * | 4/2002 | Miyazaki et al. | 438/123 |
| 2004/0262029 A1 | * | 12/2004 | McConville et al. | 174/250 |
| 2006/0231953 A1 | * | 10/2006 | Murata et al. | 257/738 |

\* cited by examiner

*Primary Examiner*—Alonzo Chambliss
(74) *Attorney, Agent, or Firm*—Troxell Law Office, PLLC

(57) ABSTRACT

A wiring substrate with tensile-strength enhanced traces primarily comprises a core layer, a plurality of connecting pads, a plurality of traces, and a solder resist where the connecting pads and the traces are disposed on a top of the core layer. The solder resist is formed over the top of the core layer to cover the traces with the connecting pads partially or completely exposed. Furthermore, the traces have I-shaped cross sections to enhance the tensile strength of the traces.

15 Claims, 5 Drawing Sheets

WIRING SUBSTRATE WITH IMPROVEMENT IN TENSILE STRENGTH OF TRACES

FIELD OF THE INVENTION

The present invention relates to a wiring substrate, and more particularly, to a wiring substrate with tensile-strength enhanced traces for semiconductor packaging.

BACKGROUND OF THE INVENTION

A wiring substrate is used as a chip carrier for electrical connections in semiconductor packaging. An IC chip during operation will generate heat which will accumulate and raise the temperature of the wiring substrate. After the IC chip is shut down, the wiring substrate will cool down and the temperature will drop to room temperature. As a matter of fact, the wiring substrate is under thermal cycles when an IC chip is turned on and off and during operation. Moreover, during these thermal cycles, thermal stresses will generate inside the wiring substrate where the traces are easily broken.

As shown in FIG. 1 and FIG. 2, a conventional wiring substrate 100 comprises a core layer 110 where a plurality of connecting pads 120 and a plurality of traces 130 covered by a solder resist 140 are formed on the core layer 110. The traces 130 are disposed on the core layer 110 and connect the corresponding connecting pads 120 to the internal via or internal connecting pads. The connecting pads 120 can be the external connecting pads of an IC package which can be placed with solder balls or printed with solder paste. The solder resist 140 covers the traces 130 with the connecting pads 120 partially exposed. Each trace 130 has a top surface 131 and a bottom surface 132 with rectangular cross sections. The bottom surfaces 132 of the traces 130 are attached to the core layer 110 of the substrate. Normally the top surfaces 131 and vertical sidewalls of the traces 130 are covered by the solder resist 140. The tensile strengths of the traces are related to the width of the bottom surfaces 132 of the traces 130. However, as the wiring density is increased, the widths of the traces 130 become smaller, i.e., the width of the bottom surfaces 131 of the traces 130 become smaller, poor tensile strengths of the traces 130 are expected which is confirmed by thermal cycle test, TCT. Broken circuits are found in some of the traces 130 in the wiring substrate 100 leading to electrical open.

SUMMARY OF THE INVENTION

The main purpose of the present invention is to provide a wiring substrate with tensile-strength enhanced traces to overcome electrical open caused by broken circuits during TCT, especially the high-density substrates for IC packaging.

According to the present invention, a wiring substrate with tensile-strength enhanced traces comprises a core layer, a plurality of connecting pads, a plurality of traces, and a solder resist layer where the connecting pads which can be round are disposed on the core layer. The traces are disposed on the top surface of the core layer and connected to the connecting pads. The solder resist is formed over the core layer to cover the traces with connecting pads partially exposed where the traces have I-shaped cross sections. Parts of the traces can be embedded in the core layer of the wiring substrate. Furthermore, each trace has a top surface and a bottom surface with two opposing indentation sides where the top surface are covered by the solder resist. The bottom surfaces are attached to the core layer of the wiring substrate. The wiring substrate further comprises a dielectric layer disposed between the core layer and the solder resist to cover the indentation sides of the traces where the dielectric layer comprises materials similar to the solder resist.

DETAIL DESCRIPTION OF THE INVENTION

Please refer to the attached drawings, the present invention will be described by means of embodiment(s) below.

Figure 1:
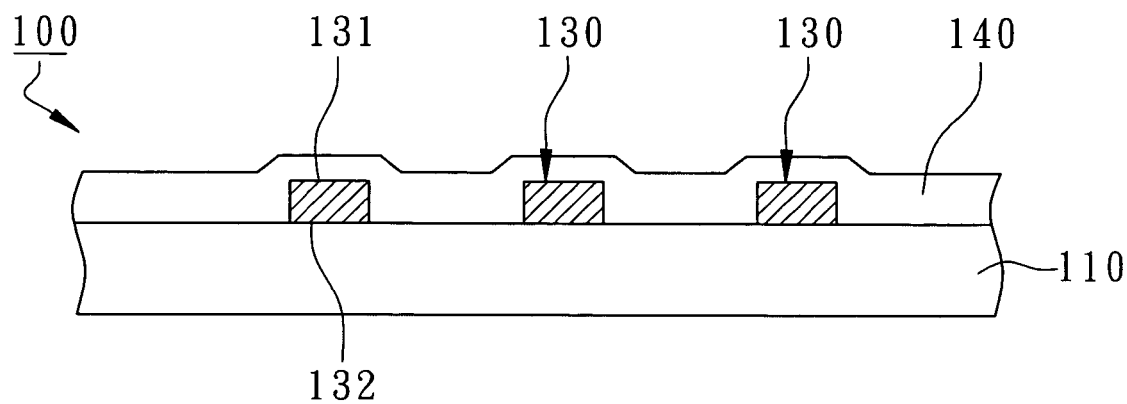
FIG. 1 shows a partial cross sectional view of a conventional wiring substrate.
Figure 2:
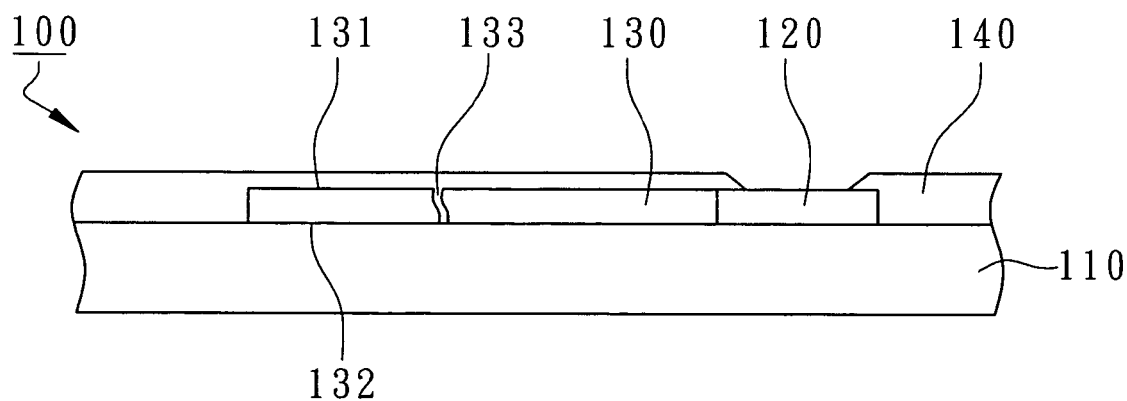
FIG. 2 shows a partial cross sectional view of a trace of a conventional wiring substrate.
Figure 3:
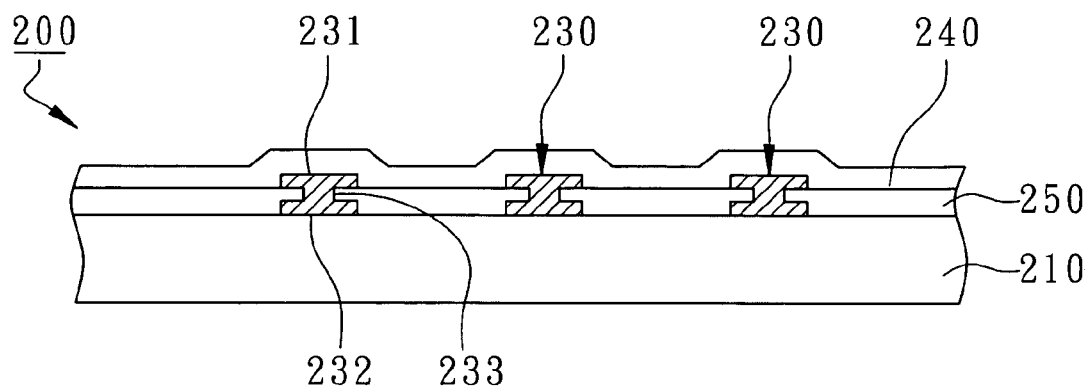
FIG. 3 shows a partial cross sectional view of a wiring substrate with tensile-strength enhanced traces according to the first embodiment of the present invention.
Figure 4:
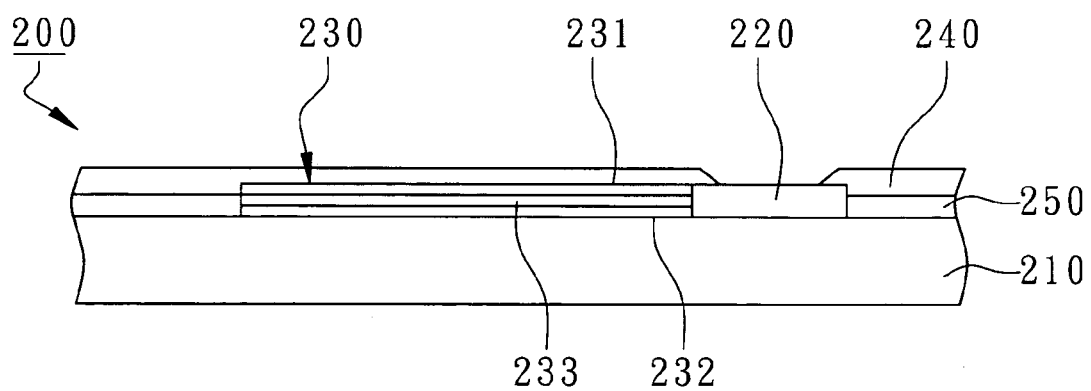
FIG. 4 shows a partial cross sectional view of the wiring substrate along one of the traces according to the first embodiment of the present invention.

According to the first embodiment of the present invention, a wiring substrate with tensile-strength enhanced traces is revealed. As shown in FIG. 3 and FIG. 4, the wiring substrate 200 with tensile-strength enhanced traces mainly comprises a core layer 210, a plurality of connecting pads 220, a plurality of traces 230, and a solder resist 240.

The materials of the core layer 210 are dielectric materials such as glass-fiber reinforced resins, FR-3, FR-4 or PI (polyimide). The wiring substrate 200 can have a plurality of core layers 210 according to the number of circuit layers.

The connecting pads 220 are disposed on the core layer 210 where the materials of the connecting pads 220 can be copper or other conductive materials for external electrical connecting points. In the present embodiment, the connecting pads 220 are round for solder ball placement or solder paste printing to be external terminals of IC packages.

The traces 230 are disposed on the core layer 210 where one ends of the traces 230 connect the connecting pads 220 and the other ends to via or gold finger of the wiring substrate 200 for electrical interconnections. The materials of the traces 230 may be copper or other conductive materials.

The solder resist 240 is formed over the core layer 210 to cover the traces 230 with connecting pads 220 partially or completely exposed. Normally, a protection metal layer, not shown in the figure, is disposed on the exposed surfaces of the connecting pads 220 such as nickel/gold, tin, tin-lead, etc. to prevent oxidation of the connecting pads 220 and to enhance external solderbility.

Furthermore, as shown in FIG. 3, the traces 230 have I-shaped cross sections and is covered by the solder resist. In the present embodiment, each trace 230 has a top surface 231, a bottom surface 232, and two opposing indentation sides 233. The bottom surfaces 232 of the traces 230 are attached to the core layer 210 and the solder resist 240 at least covers the top surfaces 231 of the traces 230. Each indentation side 233 has a continuous groove. In the present embodiment, the wiring substrate 220 further comprises a dielectric layer 250 disposed between the core layer 210 and the solder resist 240 to cover the indentation sides 233 of the traces 230. Preferably, the dielectric layer 250 further comprises materials similar to the solder resist 240 so that the disposing method of the dielectric layer 250 can be the same as the solder resist 240 for simplifying the formation of the dielectric layer 250.

Therefore, the traces 230 have much better tensile strengths than conventional traces. When implemented in IC packaging, an IC package can comprise the wiring substrate 200 mentioned above with a plurality of solder balls, not shown in the figure, placed on the connecting pads 220. The width of the traces 230 can be smaller without electrical open causing by broken circuits during TCT.

Figure 5A:
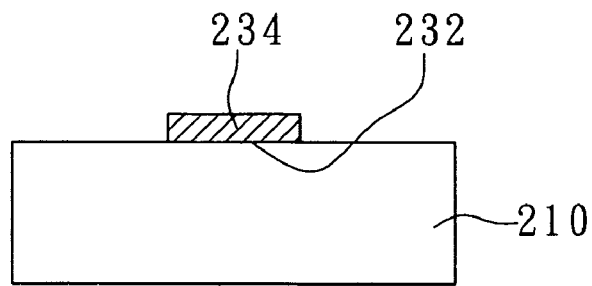
FIG. 5A to FIG. 5E show partial cross sectional views of a trace during manufacturing processes according to the first embodiment of the present invention.
Figure 5B:
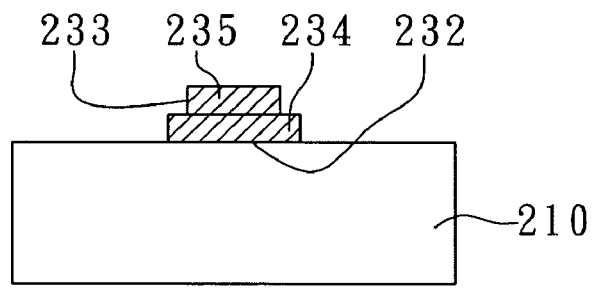
Figure 5C:
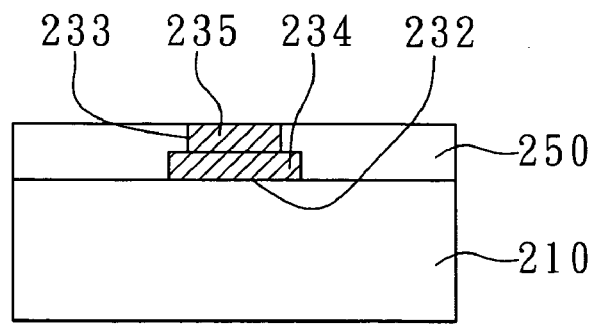
Figure 5D:
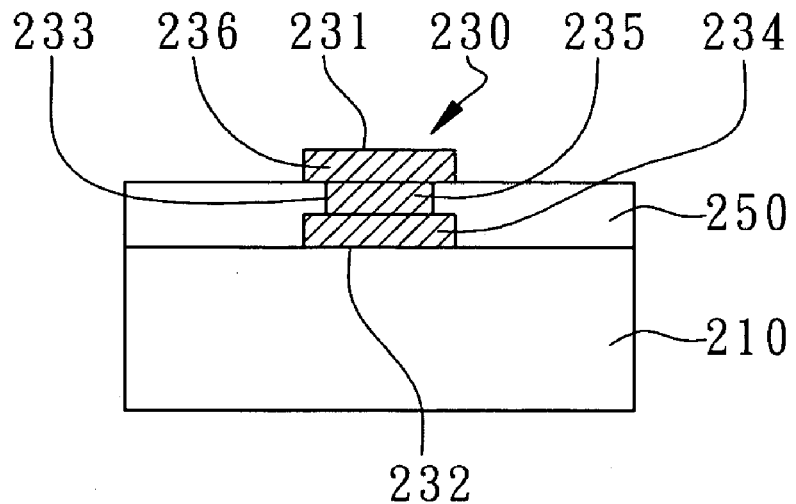
Figure 5E:
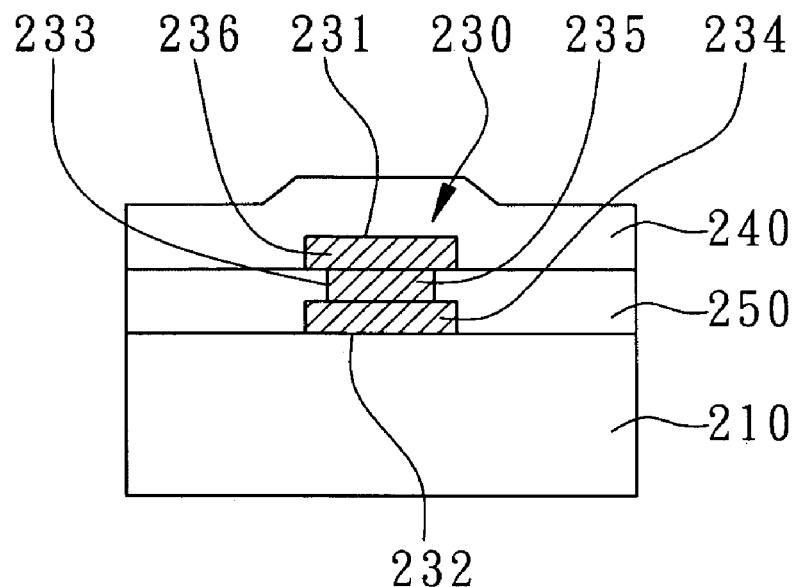

The manufacturing processes of the traces 230 of the wiring substrate 200 are described from FIG. 5A to FIG. 5E. Firstly, as shown in FIG. 5A, a core layer 210 is provided. Then, a copper film is laminated on the core layer and etched to form bottom layers 234 of the traces 230 where the bottom of the bottom layers 234 is the bottom surfaces 232 of the traces 230 where the thickness of the copper film is about one-third of the ones of the traces 230. Then, as shown in FIG. 5, a middle layer 235 is formed on the bottom layer 234 by electrical plating where the width of the middle layer 235 is smaller than the one of the bottom layer 234 to form the indentation sides 233. Then, as shown in FIG. 5C, a dielectric layer 250 is formed on the exposed area of the core layer 210 by printing or by deposition. More particularly, the middle layer 235 is exposed from the dielectric layer 250 when forming the dielectric layer 250 or by polishing the dielectric layer 250 after forming the dielectric layer 250. Then, as shown in FIG. 5D, a top layer 236 is formed on the top of the middle layer 235 by electrical plating of copper where the width of the top layer 236 is greater than the one of the middle layer 235. Moreover, parts of the top layer 236 can be formed on the top of the dielectric layer 250 to be the top surface 231 of the traces 230 then the traces 230 are formed. Finally, as shown in FIG. 5E, a solder resist 240 is formed over the dielectric layer 250 to cover the top surfaces 231 of the traces 230 to form a trace 230 with I-shaped cross section and having the indentation sides 233.

Figure 6:
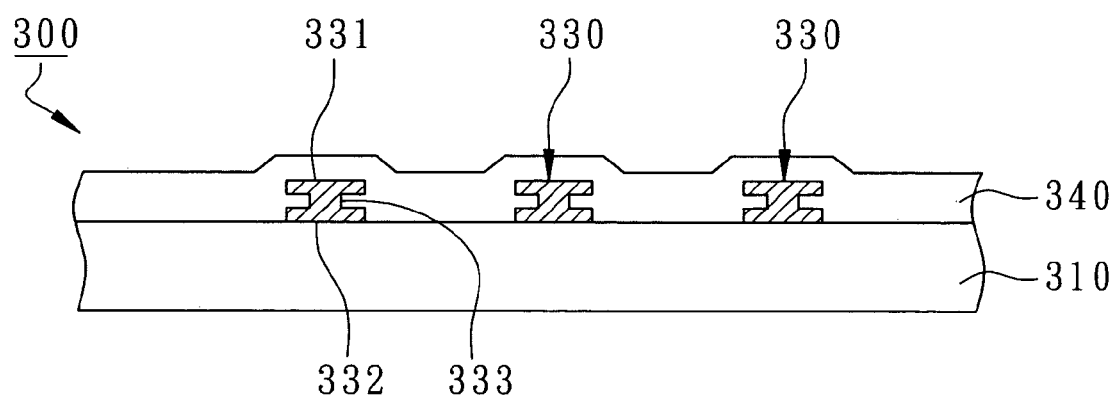
FIG. 6 shows a partial cross sectional view of another wiring substrate with tensile-strength enhanced traces according to the second embodiment of the present invention.

In the second embodiment of the present invention, another wiring substrate with tensile-strength enhanced traces is revealed in FIG. 6 where the wiring substrate 300 comprises a core layer 310, a plurality of connecting pads, not shown in the figure, a plurality of traces 330, and a solder resist 340.

The connecting pads and the traces 230 are disposed on the top of the core layer 310 and the solder resist 340 is also formed on the top of the core layer 310 to cover the traces 330 with the connecting pads exposed. Furthermore, the traces 330 have I-shaped cross sections. In the present embodiment, each trace 330 has a top surface 331, a bottom surface 332, and two indentation sides 333. The bottom surfaces 332 are attached to the core layer 310 and the indentation sides 333 and the top surfaces 331 of the traces 330 are all covered by the solder resist 340. The tensile strengths of the traces 330 can be enhanced by implementation of the covered cross sections of "I" and indentation sides 333 of the traces 330.

Figure 7:
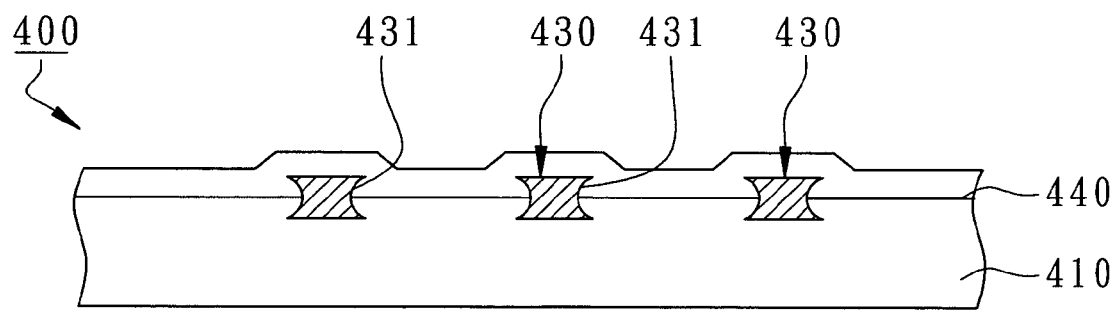
FIG. 7 shows a partial cross sectional view of another wiring substrate with tensile-strength enhanced traces according to the third embodiment of the present invention.

The third embodiment of the present invention, another wiring substrate with tensile-strength enhanced traces is revealed in FIG. 7 where the wiring substrate 400 mainly comprises a core layer 410, a plurality of traces 430, and a solder resist 440. Indentation sides are formed on the corresponding sidewalls of the traces 430 such as a concaved arc, a concaved "V", or a concaved "U" so that the cross sections of the traces 430 are "I" or funnel. Preferably, parts of the traces 430 are embedded in the core layer 410 so that the parts of the traces 430 are extruded from the core layer 410 which is covered by the solder resist 440 to enhance the tensile strengths and the position accuracy of the traces 430.

Furthermore, the formation of the traces 430 is described as follows. Firstly, a copper film is over-etched to form traces 430 with indentation sides 431. Then, the core layer 410 is laminated with the over-etched copper film so that the bottom surfaces and partial indentation sides 431 of the traces 430 are embedded in the core layer 410. Finally, a solder resist 440 is formed over the top of the core layer to cover the top surfaces and the indentation sides 431 of the traces 430.

The above description of embodiments of this invention is intended to be illustrative and not limiting. Other embodiments of this invention will be obvious to those skilled in the art in view of the above disclosure.

What is claimed is:

1. A wiring substrate comprising:
a core layer;
a plurality of connecting pads disposed on a top of the core layer;
a plurality of traces disposed on the top of the core layer and connecting the connecting pads; and
a solder resist formed over the top of the core layer to cover the traces with the connecting pads exposed;
wherein the traces have I-shaped cross sections.

2. The wiring substrate of claim 1, wherein each trace has a top surface, a bottom surface, and two indentation sides.

3. The wiring substrate of claim 2, wherein the indentation sides and the top surfaces are covered by the solder resist.

4. The wiring substrate of claim 2, further comprising a dielectric layer disposed between the core layer and the dielectric layer to cover the indentation sides of the traces.

5. The wiring substrate of claim 4, wherein the material of the dielectric layer is similar to that of the solder resist.

6. The wiring substrate of claim 2, wherein the bottom layer of the traces is attached to the core layer.

7. The wiring substrate of claim 2, wherein each indentation side has a continuous groove.

8. The wiring substrate of claim 1, wherein the connecting pads are round.

9. The wiring substrate of claim 1, wherein parts of the traces are embedded in the core layer.

10. An IC packages comprises the wiring substrate as claim in claim 1.

11. The IC package of claim 1, further comprising a plurality of solder balls connecting to the connecting pads.

12. A wiring substrate comprising:
a core layer;
a plurality of connecting pads disposed on a top of the core layer;
a plurality of traces disposed on the top of the core layer and connecting to the connecting pads; and
a solder resist formed over the top of the core layer to cover the traces with the connecting pads exposed;
wherein each trace has a top surface, a bottom surface, and two indentation sides, the indentation sides and the top surfaces are covered by the solder resist.

13. The wiring substrate of claim 12, wherein parts of the traces are embedded in the core layer.

14. The wiring substrate of claim 12, wherein the indentation sides have a shape selected from the group consisting of a concaved arc, a concaved "V", and a concaved "U".

15. The wiring substrate of claim 12, wherein each indentation side has a continuous groove.

* * * * *